(12) United States Patent
Wine

(10) Patent No.: US 11,744,157 B2
(45) Date of Patent: Aug. 29, 2023

(54) SYSTEMS AND METHODS OF ACTIVE CONTROL OF SURFACE DRAG USING SELECTIVE WAVE GENERATION

(71) Applicant: Deep Science, LLC, Bellevue, WA (US)

(72) Inventor: David William Wine, Seattle, WA (US)

(*) Notice: Subject to any disclaimer, the term of this patent is extended or adjusted under 35 U.S.C. 154(b) by 730 days.

(21) Appl. No.: 16/696,810

(22) Filed: Nov. 26, 2019

(65) Prior Publication Data

US 2020/0176664 A1 Jun. 4, 2020

Related U.S. Application Data

(60) Provisional application No. 62/773,805, filed on Nov. 30, 2018.

(51) Int. Cl.
*H10N 30/80* (2023.01)
*G01N 29/02* (2006.01)
*H10N 30/20* (2023.01)

(52) U.S. Cl.
CPC ......... *H10N 30/802* (2023.02); *G01N 29/022* (2013.01); *H10N 30/20* (2023.02); *G01N 2291/0422* (2013.01); *G01N 2291/0423* (2013.01)

(58) Field of Classification Search
CPC ..... H01L 41/042; H01L 41/09; G01N 29/022; G01N 2291/0422; G01N 2291/0423; F15D 1/007; F15D 1/12; B64C 21/10; B64C 23/04; Y02T 50/10
USPC ........................................................ 310/311
See application file for complete search history.

(56) References Cited

U.S. PATENT DOCUMENTS

| | | |
|---|---|---|
| 1,903,823 A | 4/1933 | Lougheed |
| 2,440,198 A | 4/1948 | Green |
| 3,289,978 A | 12/1966 | Banaszak |
| 3,578,264 A | 5/1971 | Kuethe |
| 4,102,519 A | 7/1978 | Crosby, Jr. |
| 4,309,901 A | 1/1982 | Rolinski et al. |
| 4,516,747 A | 5/1985 | Lurz |
| 4,526,031 A | 7/1985 | Weisend et al. |
| 4,611,492 A | 9/1986 | Koosmann |

(Continued)

FOREIGN PATENT DOCUMENTS

| | | |
|---|---|---|
| EP | 1 481 467 B1 | 12/2004 |
| EP | 2 012 139 A1 | 1/2009 |

(Continued)

OTHER PUBLICATIONS

Smart Materials and Structures, Microsensors, microelectromechanical systems (MEMS), and electronics for smart structures and systems, Varadan (Year: 2000).*

(Continued)

*Primary Examiner* — Jacques M Saint Surin
(74) *Attorney, Agent, or Firm* — PCFB, LLC; Justin K. Flanagan

(57) ABSTRACT

A system includes a surface, an actuator, and a controller. The surface has a fluid flowing over the surface. The actuator is coupled to the surface to move the surface relative to the fluid. The controller causes the actuator to cause the surface to generate a surface wave that modifies drag in the fluid. The actuator can cause the surface to generate a Love wave.

29 Claims, 6 Drawing Sheets

(56) References Cited

U.S. PATENT DOCUMENTS

| | | | |
|---|---|---|---|
| 4,932,612 A | 6/1990 | Blackwelder et al. | |
| 5,037,044 A | 8/1991 | Seyfang | |
| 5,106,017 A | 4/1992 | Hicks | |
| 5,209,438 A | 5/1993 | Wygnanski | |
| 5,359,574 A | 10/1994 | Nadolink | |
| 5,365,490 A | 11/1994 | Katz | |
| 5,369,345 A | 11/1994 | Phan et al. | |
| 5,374,011 A | 12/1994 | Lazarus et al. | |
| 5,445,346 A | 8/1995 | Gilbert | |
| 5,531,407 A | 7/1996 | Austin et al. | |
| 5,540,406 A | 7/1996 | Occhipinti | |
| 5,558,156 A | 9/1996 | Tsutsui | |
| 5,558,304 A | 9/1996 | Adams | |
| 5,573,012 A | 11/1996 | McEwan | |
| 5,598,990 A | 2/1997 | Farokhi et al. | |
| 5,755,408 A | 5/1998 | Schmidt et al. | |
| 5,808,210 A | 9/1998 | Herb et al. | |
| 5,874,671 A | 2/1999 | Lopez | |
| 5,942,682 A | 8/1999 | Ghetzler et al. | |
| 5,953,773 A * | 9/1999 | Asada | A61G 7/1019 5/81.1 R |
| 5,957,413 A | 9/1999 | Glezer et al. | |
| 5,961,080 A | 10/1999 | Sinha | |
| 5,964,433 A | 10/1999 | Nosenchuck | |
| 5,988,522 A * | 11/1999 | Glezer | F15C 5/00 239/11 |
| 5,988,568 A | 11/1999 | Drews | |
| 6,016,286 A | 1/2000 | Olivier et al. | |
| 6,024,119 A | 2/2000 | Kirschner | |
| 6,109,565 A | 8/2000 | King, Sr. | |
| 6,123,145 A | 9/2000 | Glezer et al. | |
| 6,123,296 A | 9/2000 | Mangalam | |
| 6,131,853 A | 10/2000 | Bauer et al. | |
| 6,215,221 B1 | 4/2001 | Cabuz et al. | |
| 6,332,593 B1 | 12/2001 | Kamiadakis et al. | |
| 6,443,394 B1 | 9/2002 | Weisend, Jr. | |
| 6,484,971 B2 | 11/2002 | Layukallo | |
| 6,644,598 B2 * | 11/2003 | Glezer | F15D 1/12 244/200 |
| 6,662,647 B2 | 12/2003 | Schoess et al. | |
| 6,795,763 B2 | 9/2004 | Yao et al. | |
| 6,821,090 B1 | 11/2004 | Hassan et al. | |
| 6,862,502 B2 | 3/2005 | Peltz et al. | |
| 6,871,816 B2 | 3/2005 | Nugent et al. | |
| 6,874,748 B2 | 4/2005 | Hanagan | |
| 6,966,231 B2 | 11/2005 | Sheplak et al. | |
| 6,979,050 B2 | 12/2005 | Browne et al. | |
| 7,031,871 B2 | 4/2006 | Severson et al. | |
| 7,133,785 B2 | 11/2006 | Larson et al. | |
| 7,204,731 B2 | 4/2007 | Gusler | |
| 7,251,592 B1 | 7/2007 | Praisner et al. | |
| 7,375,911 B1 | 5/2008 | Li et al. | |
| 7,380,756 B1 | 6/2008 | Enloe et al. | |
| 7,434,170 B2 | 10/2008 | Novak et al. | |
| 7,537,182 B2 | 5/2009 | Greenblatt | |
| 7,703,839 B2 | 4/2010 | McKnight et al. | |
| 7,854,467 B2 | 12/2010 | McKnight et al. | |
| 7,913,928 B2 | 3/2011 | Tiliakos et al. | |
| 8,006,939 B2 * | 8/2011 | McClure | F15D 1/12 244/130 |
| 8,074,938 B2 | 12/2011 | Hyde et al. | |
| 8,074,939 B2 | 12/2011 | Hyde et al. | |
| 8,091,950 B2 | 1/2012 | Corke et al. | |
| 8,267,355 B1 | 9/2012 | Patel et al. | |
| 8,286,909 B2 | 10/2012 | Lee | |
| 8,308,112 B2 | 11/2012 | Wood et al. | |
| 8,436,509 B1 | 5/2013 | Branch | |
| 8,640,995 B2 | 2/2014 | Corke et al. | |
| 8,783,337 B2 | 7/2014 | Hyde et al. | |
| 8,794,574 B2 | 8/2014 | Lang | |
| 8,894,019 B2 | 11/2014 | Alvi | |
| 9,002,484 B2 | 4/2015 | Hyde et al. | |
| 9,410,527 B2 | 8/2016 | Hsu | |
| 9,541,106 B1 | 1/2017 | Patel et al. | |
| 9,640,995 B2 | 5/2017 | Thorburn | |
| 9,834,301 B1 | 12/2017 | Patel et al. | |
| 9,848,485 B2 | 12/2017 | Corke et al. | |
| 9,883,822 B2 * | 2/2018 | Bhagavat | H01L 27/14636 |
| 9,908,616 B1 | 3/2018 | Horn et al. | |
| 10,527,074 B2 * | 1/2020 | Corke | F15D 1/12 |
| 10,543,908 B2 | 1/2020 | Stefes et al. | |
| 11,299,260 B2 * | 4/2022 | Wine | B64C 23/02 |
| 11,519,433 B2 * | 12/2022 | Wine | F15D 1/0075 |
| 2002/0079405 A1 | 6/2002 | Layukallo | |
| 2002/0125376 A1 | 9/2002 | Karniadakis et al. | |
| 2002/0131474 A1 | 9/2002 | Suga | |
| 2004/0197519 A1 | 10/2004 | Elzey et al. | |
| 2004/0249257 A1 | 12/2004 | Tupin et al. | |
| 2005/0088057 A1 | 4/2005 | Kando | |
| 2005/0121240 A1 | 6/2005 | Aase et al. | |
| 2005/0163963 A1 | 7/2005 | Munro et al. | |
| 2005/0241605 A1 | 11/2005 | Bedwell et al. | |
| 2006/0022092 A1 | 2/2006 | Miller et al. | |
| 2006/0040532 A1 | 2/2006 | Ozawa et al. | |
| 2006/0060722 A1 | 3/2006 | Choi et al. | |
| 2006/0236777 A1 | 10/2006 | Chambers et al. | |
| 2007/0113932 A1 | 5/2007 | Tiliakos et al. | |
| 2008/0128027 A1 | 6/2008 | Hyde et al. | |
| 2008/0128560 A1 | 6/2008 | Hyde et al. | |
| 2008/0128561 A1 | 6/2008 | Hyde et al. | |
| 2008/0193307 A1 | 8/2008 | Elata et al. | |
| 2008/0245520 A1 | 10/2008 | Hyde et al. | |
| 2009/0173837 A1 | 7/2009 | Silkey et al. | |
| 2010/0123046 A1 | 5/2010 | Khozikov et al. | |
| 2010/0219296 A1 | 9/2010 | Shelman-Cohen | |
| 2011/0224846 A1 | 9/2011 | Simon | |
| 2011/0295102 A1 | 12/2011 | Lakkis et al. | |
| 2012/0193483 A1 | 8/2012 | Essenhigh et al. | |
| 2013/0009016 A1 | 1/2013 | Fox et al. | |
| 2015/0191244 A1 | 7/2015 | Rolston | |
| 2015/0257653 A1 | 9/2015 | Hyde et al. | |
| 2016/0089052 A1 | 3/2016 | Cho et al. | |
| 2016/0174842 A1 | 6/2016 | Hyde et al. | |
| 2018/0298762 A1 | 10/2018 | Shelman-Cohen | |
| 2019/0136881 A1 | 5/2019 | Amitay et al. | |
| 2020/0031456 A1 | 1/2020 | Wine et al. | |
| 2020/0148335 A1 | 5/2020 | Wine et al. | |
| 2020/0176664 A1 | 6/2020 | Wine | |
| 2020/0191177 A1 | 6/2020 | Wine et al. | |
| 2020/0217337 A1 | 7/2020 | Loebig | |
| 2021/0348628 A1 | 11/2021 | Holloway et al. | |

FOREIGN PATENT DOCUMENTS

| | | |
|---|---|---|
| FR | 1053332 A | 2/1954 |
| WO | WO-01/76934 A1 | 10/2001 |
| WO | WO-02/103304 A2 | 12/2002 |
| WO | WO-2006/040532 A1 | 4/2006 |
| WO | WO-2012/054086 A1 | 4/2012 |
| WO | WO-2016/179405 A1 | 11/2016 |
| WO | WO-2016/189448 A2 | 12/2016 |

OTHER PUBLICATIONS

International Search Report for PCT/US2019/063409, dated Feb. 21, 2020, 16 pages.

Ainajjar et al., "Receptivity of high-speed jets to excitation using an array of mems-based mechanical actuators", SME Fluids Engineering Division Summer Meeting, Jun. 22-26, 1997, pp. 1-6.

Alfredsson et al., "Large-eddy breakup devices—a 40 years perspective from a stockholm horizon", Flow Turbulence Combust, 2018, vol. 100, pp. 877-888.

Bird et al., "Compliant kagome lattice structures for generating in-plane waveforms", 2018, vol. 41, No. 142, pp. 86-101.

Bird et al., "Experimental control of turbulent boundary layers with in-plane travelling waves", Flow Turbulence Combust, 2018, vol. 100, pp. 1015-1035.

Bird et al., "In-plane forcing of a turbulent boundary layer, through the actuation of a compliant structure", DRFCM, 2015, pp. 1-2.

Braslow, "A History of suction-type laminar-flow control with emphasis on flight research", 1999, pp. 1-84.

(56) References Cited

OTHER PUBLICATIONS

Bushnell, "Chapter VIII : compliant surfaces introduction", Viscous Flow Drag Reduction, 1980, pp. 687-390.
Cattafesta et al., "Actuators for active flow control", Annu. Rev. Fluid Mech., 2001, vol. 43, pp. 247-272.
Chamorro et al., "Drag reduction of large wind turbine blades through riblets: evaluation of riblet geometry and application strategies", Renewable Energy, 2013, vol. 50, pp. 1095-1105.
Corke et al., "Active and passive turbulent boundary layer drag reduction", AIM Journal, 2018, vol. 56, pp. 3835-3847.
Gad-El-Hak et al., "Separation control: review", Journal of Fluids Engineering, 1991, vol. 13, pp. 5-30.
Gad-El-Hak, "Chapter 9: drag reduction using compliant walls", Flow Past Highly Compliant Boundaries and in Collapsible Tubes, Eds. Carpenter and Pedley, Mar. 26-31, 2001, pp. 191-229.
Garcia-Mayoral et al., "Drag rReduction by riblets", Phil Trans. R. Soc A, 2011, vol. 369, pp. 1412-1427.
Gatti et al., "Reynolds-number dependence of turbulent skin-friction drag reduction induced by spanwise forcing", J. Fluid Mech, 2016, vol. 802, pp. 553-582.
Gatti, "Turbulent drag reduction at moderate reynolds number via spanwise velocity waves", PAMM, 2012, 133 pages.
Gouder, "Turbulent friction drag reduction using electroactive polymer surfaces", Doctoral Thesis, Imperial College, May 2011.
Grosjean et al., "Micro balloon actuators for aerodynamic control", IEEE Proceedings MEMS 98, Jan. 25-28, 1998, pp. 1-6.
Hong et al., "Turbulent drag reduction with polymers in rotating disk flow", Polymers, vol. 7, pp. 279-1298.
Huang et al., "MEMS transducers for aerodynamics—a paradym shift", 38th Aerospace Sciences Meeting, 2000, pp. 1-7.
Hurst et al., "The effect of reynolds number on turbulent drag reduction by streamwise travelling waves", J. Fluid Mech., 2014, vol. 759, pp. 28-55.
Jones et al., "Modelling for robust feedback control of fluid flows", Journal of Fluid Mechanics, 2015, vol. 769, pp. 1-34.
Jung et al., "Suppression of turbulence in wall-bounded flows by high-frequency spanwise oscillations", Phys_ Fluids A, 1992, vol. 4, No. 8, pp. 1605-1607.
Kang et al., "Active wall motions for skin-friction drag reduction", Physics of Fluids, 2000, vol. 12, No. 12, pp. 3301-3304.
Karniadakis et al., "Mechanism on transverse motions in turbulent wall flows", Annu. Rev. Fluid Mech., 2003, vol. 35, pp. 45-62.
Kasagi et al., "Toward cost-effective control of wall turbulence of skin friction drag reduction", Advances in Turbulence XII, 2009, pp. 189-200.
Kline et al., "The structure of turbulent boundary layers", Journal of Fluid Mechanics, 1967, vol. 30, pp. 741-773.
Laadhari et al., "Turbulence reduction in a boundary layer by a local spanwise oscillating surface", Physics of Fluids, 1994, vol. 6, pp. 3218-3220.
Lee et al., "Control of roll moment by MEMS". American Society of Mechanical Engineers, 1996, pp. 1797-1803.
Leschziner, "Friction-drag reduction by transverse wall motion—a review", J. of Mechanics, DOI: 10.1017/ mech.2020_31, 15 pages.
Luhar et al., "A framework for studying the effect of compliant surface on wall turbulence", J. Fluid Mech., 2015, vol. 768, pp. 415-441.
Mahfoze et al., "Skin-friction drag reduction in a channel flow with streamwise-aligned plasma actuators," Intl J. of Heat and Fluid Flow, Butterworth Scientific LTD., Guildford, GB, 2017, vol. 66, pp. 83-94.
Marusic et al., "Predictive model for wall-bounded turbulent flow", Science, 2010, vol. 329, No. 5988, pp. 193-196.
Mathis et al., "Estimating wall-shear-stress fluctuations given an outer region input", Journal of Fluid Mechanics, 2013, vol. 715, pp. 163-180.
Melton et al., "Active flow control via discrete sweeping and steady jets on a simple-hinged flap", Aug. 2018, IM Journal, vol. 56, No. 8, pp. 2961-2973.
Morrison, "MEMS devices for active drag reduction in aerospace applications", Electronic and Optical Materials, 2014, pp. 153-176.
Naguib et al., "Arrays of MEMS-based actuators for control of supersonic jet screech", AIM, Jun. 29-Jul. 2, 1997, pp. 1-9.
Panton, "Overview of the self-sustaining mechanisms of wall turbulence", Prog. Aerosp. Sci., 2001, vol. 37, pp. 41-383.
Quadrio et al., "Streamwise-traveling waves of spanwise wall velocity for turbulent drag reduction", 2009, vol. 627, pp. 161-178.
Quadrio, "The laminar generalized stokes layer and turbulent drag reduction", J. Fluid. Mech., 2011, vol. 667, pp. 135-157.
Ricco, "Active and passive turbulent drag reduction", Workshop on Turbulent Skin Friction Drag Reduction, Imperial College London, Dec. 4-5, 2017, pp. 1-60.
Sareen et al., "Drag reduction using riblet film applied to airfoils for wind turbines", 49th Aerospaces Sciences Meeting, Jan. 4-7, 2011, pp. 1-19.
Schoppa et al., "A large-scale control strategy for drag reduction in turbulent boundary layers", Physics of Fluids, 1998, vol. 10, No. 5, pp. 1049-1051.
Schroder, "Drag reduction via transversal wave motions", Institute of Aerodynamics, 2017, pp. 1-22.
Shen, "Turbulent flow over a flexible wall undergoing a streamwise travelling wave motion", J. Fluid Mech., 2003, vol. 484, pp. 197-221.
Smith et al., "The characteristics of low-speed streaks in the near-wall region of a turbulent boundary layer", Journal of Fluid Mechanics, 1983, vol. 129, pp. 27-54.
Smits et al., "High reynolds number wall turbulence", Annu. Rev. Fluid Mech., 2011, vol. 43, pp. 353-375.
Symeonidis et al., "Drag reduction in wall-bound turbulence via a transverse travelling wave", J. Fluid Mech., 2002, vol. 457, pp. 1-34.
Tamano, "Turbulent drag reduction due to spanwise traveling waves with wall deformation", Nov. 20, 2014, OR 1779 Symposium, pp. 1-51.
Thomas et al., "Turbulent drag reduction using pulsed-DC plasma actuation", J. of Physics D: Appl. Phys., 2019, vol. 52, No. 34001, 13 pages.
Tomiyama et al., "Direct numerical simulation of drag reduction in a turbulent channel flow using spanwise traveling wave-like wall deformation", Physics of Fluids, 2013, vol. 25, pp. 1-22.
Tsao, "An integrated mems system for turbulent boundary layer control", IEEE Solid State Sensors and Actuators, 1997, pp. 1-4.
Tsao, "Micromachined magnetic actuators for active fluid control", International Mechanical Engineering Congress and Exposition, 1994, pp. 31-38.
Van Buren et al., "Piezoelectric driven oscillating surface (PDOS)", RPI, 2014, 6 pages.
Viotti et al., "Streamwise oscillation of spanwise velocity at the wall of a channel for turbulent drag reduction", Physics of Fluids, 2009, vol. 21, pp. 1-9.
Wang, "Flow over a surface with parallel grooves", May 2003, vol. 15, No. 5, pp. 1114-1121.
Yang et al., "Micro bellow actuators", IEEE International Solid State Sensors and Actuators Conference, 1997, pp. 1-4.
Zhao et al., "Turbulent drag reduction by traveling wave of flexible wall", Fluid Dynamics Research, 2004, vol. 34, pp. 175-198.
Zhong et al., "Reduction of pressure losses in a linear cascade using herringbone riblets", School of Mechanical, Aerospace and Civil Engineering, University of Manchester, Aug. 17, 2017, 16 pages.
Hudson, "Love Waves in a Heterogeneous Medium" (1962), The Geophysical Journal of the Royal Astonomical Society, vol. 6, No. 2, Feb. 1962, p. 131-147.
Mazein et al., "Love Wave Chemical Sensors: Design and Optimisation. Case of Organophosphorous Compounds Detection." (2004) IEEE, p. 31-35.
White, "Surface Elastic Waves" (1970), Proceedings of the IEEE, vol. 58, No. 8, Aug. 1970.

\* cited by examiner

SYSTEMS AND METHODS OF ACTIVE CONTROL OF SURFACE DRAG USING SELECTIVE WAVE GENERATION

CROSS-REFERENCE TO RELATED APPLICATIONS

The present disclosure claims the benefit of priority to U.S. Provisional Application No. 62/773,805, titled "SYSTEMS AND METHODS OF ACTIVE CONTROL OF SURFACE DRAG USING SELECTIVE WAVE GENERATION," filed Nov. 30, 2018, the disclosure of which is incorporated herein by reference in its entirety.

BACKGROUND

The present disclosure relates generally to the field of fluid flow over surfaces. More particularly, the present disclosure relates to systems and methods of active control of surface drag using selective wave generation.

Surface drag is a force that acts opposite to the relative motion of an object moving through a fluid. Air, water, and ground transportation platforms experience some measure of surface drag, which can lead to slower speeds and less fuel efficiency.

SUMMARY

One embodiment relates to a system. The system includes a surface, an actuator, and a controller. The surface has a fluid flowing over the surface. The actuator is coupled to the surface to move the surface relative to the fluid. The controller causes the actuator to cause the surface to generate a surface wave that modifies drag in the fluid. The actuator can cause the surface to generate a Love wave.

Another embodiment relates to a method. The method includes coupling an actuator to a surface having a fluid flowing over the surface. The method includes causing, by a controller, the actuator to cause the surface to move relative to the fluid to generate a surface wave that modifies drag in the fluid.

This summary is illustrative only and is not intended to be in any way limiting. Other aspects, inventive features, and advantages of the devices and/or processes described herein, as defined solely by the claims, will become apparent in the detailed description set forth herein, taken in conjunction with the accompanying figures, wherein like reference numerals refer to like elements.

DETAILED DESCRIPTION

Figure 1:
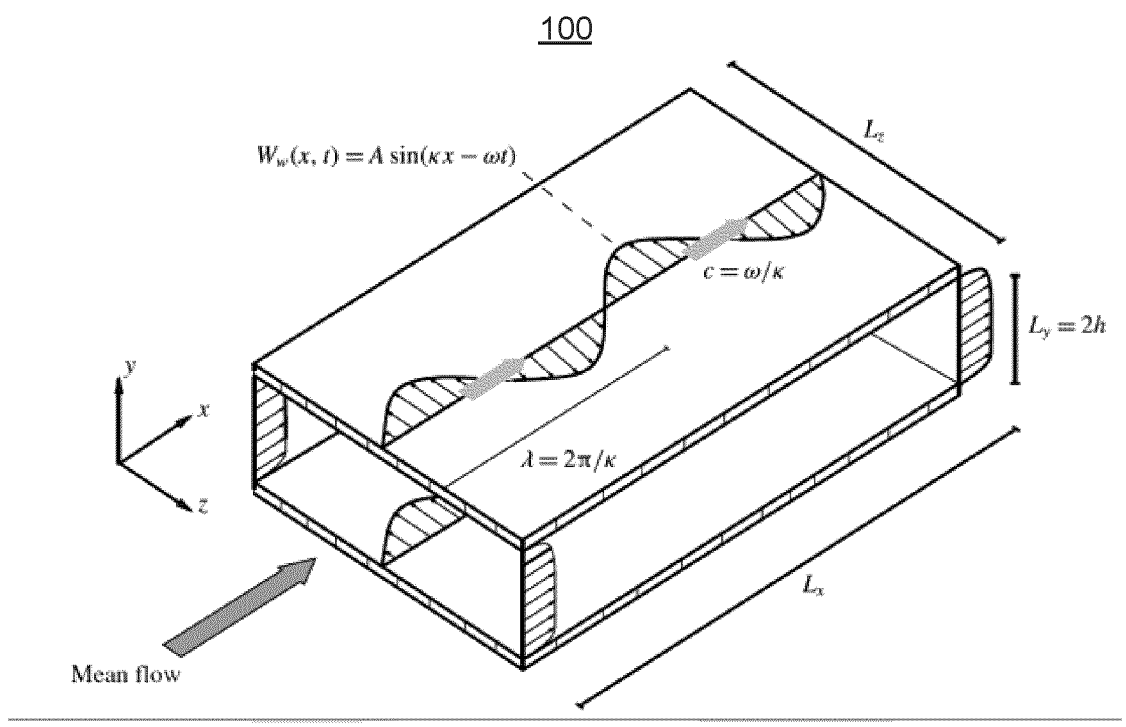
FIG. 1 is a schematic diagram of a transverse surface wave according to an embodiment of the present disclosure.

Before turning to the figures, which illustrate the exemplary embodiments in detail, it should be understood that the present disclosure is not limited to the details or methodology set forth in the description or illustrated in the figures. It should also be understood that the terminology used herein is for the purpose of description only and should not be regarded as limiting.

Referring generally to the figures, systems and methods described herein can be used to actively control drag on surfaces. Drag is a force acting opposite to the relative motion of any object moving with respect to a surrounding fluid. Drag manipulation technology has a wide range of applications for improving performance of systems that involve fluid flowing over a surface. For example, efficiency and speed can be increased in all manners of air transportation, including commercial aircraft, military aircraft, rockets, unmanned aerial vehicles, and general aviation. Reducing drag also increases efficiency in ground transportation such as in trains, cars, and tractor trailers. Water transportation, including maritime shipping, personal boating, and undersea transportation can similarly be benefited by reducing drag. Reducing drag can also boost efficiency when transporting fluids through pipes such as in natural gas or oil pipelines. Manipulating drag can be valuable across a wide range of Reynolds numbers, including relatively high Reynolds numbers experienced by maritime shipping through water and the relatively low Reynolds numbers experienced by unmanned aerial vehicles. Selectively increasing drag can also be useful for braking, steering, and other control of bodies moving through the fluid, such as movable platforms (e.g., vehicles). Being able to actively control surface drag of an object allows for not only the minimization of surface drag when efficiency or speed is most needed, but it can also allow for better steering and braking capabilities through selectively increasing surface drag.

Air acts as a viscous fluid at sub-sonic speeds. An object moving through air may collect a group of air particles, which the object tends to pull along as the object moves. Air particles close to the surface of the object tend to move with approximately the same velocity as the object due to molecular adhesion. As a flat plate, airfoil, or other object moves through a free stream of air at a given relative velocity, molecular adhesion causes a boundary layer of air having relative velocities below that of the relative free stream velocity to form adjacent the object surface. The boundary layer can be a layer of air surrounding an object in which the relative velocity of the layer of molecules closest to the object is at or near zero, and in which the relative velocity at successively distant points from the object increases until it approaches that of the free stream, at which point the outer limit of the boundary layer is reached. For example, for an airfoil, the boundary layer can include the interface between the airfoil and the air mass surrounding the airfoil. The boundary layer may be relatively small as compared to a size dimension of the object. The difference between the free stream velocity and the relative velocities in the boundary layer region contribute to drag. Thus, increasing the relative velocities in the boundary layer region can reduce drag, and conversely, decreasing the relative velocities in the boundary layer region can increase drag. Drag may be caused by disturbances in flow, retarding flow near a surface. Such disturbances may not be damped as Reynolds number increases, which can lead to interactions that cause increasing disturbances, such as turbulent eddies. Disturbances may flow away from the surface into the outer boundary layer, which can cause continued disturbances. The present solution can control surface drag by controlling the difference between the velocity of the free stream and the relative velocities of the boundary layer, such as by interrupting the generation of disturbances near the surface.

Turbulent flow in boundary layers can contribute towards drag. A turbulent boundary layer can have a large number of eddies that transfer momentum from the faster moving outer portions of the boundary layer to the relatively slower portions closer to the surface. As such, turbulent boundary layers may have more surface friction than laminar boundary layers, which have more smooth flows, and are generally free from these eddies. Making the boundary layer less turbulent can be used to decrease drag, and conversely making the boundary layer more turbulent can be used to increase drag.

Referring generally to FIGS. 1-6, fluid control systems and methods in accordance with the present disclosure can be used to generate transverse surface waves, including using Love waves, to actively control surface drag corresponding to fluid flowing over surfaces. In some embodiments, a fluid control system includes a surface, an actuator, and a controller. The surface has a fluid flowing over the surface. The actuator is coupled to the surface to move the surface relative to the fluid. The controller causes the actuator to cause the surface to generate a surface wave that modifies drag in the fluid. The actuator can cause the surface to generate a Love wave.

FIG. 1 depicts a representation 100 of transverse surface waves, which can be used to modify surface drag. The transverse surface wave can have properties such as a wavelength λ and a frequency ω at which the wave propagates in a direction of propagation (e.g., direction of mean flow), along with an amplitude A according to which the wave moves transverse to (e.g., perpendicular to) the direction of propagation. However, the effectiveness of transverse surface waves has primarily been demonstrated numerically or computationally, and existing implementations may lack feasibility. For example, transverse surface waves can be approximated by a series of discrete plates. However, the motion of one or more plates relative to one another can require significant power, and generate unwanted flow fields at plate interfaces, reducing the desired effect on surface drag. The large number of interfaces can present significant wear, reliability, and deployment issues relative to a continuous surface. A Kagome lattice can mitigate some of these concerns in limited circumstances (e.g., at low frequencies and flow speeds), but involves bulk motion of a membrane, which results in unwanted out-of-plane motion. Electroactive polymer-based implementations have been attempted but suffer from similar issues and are limited in lifetime and adjustability. Existing actuation methods typically do not scale well in power or size as the flow speeds and frequencies increase.

Figure 2A:
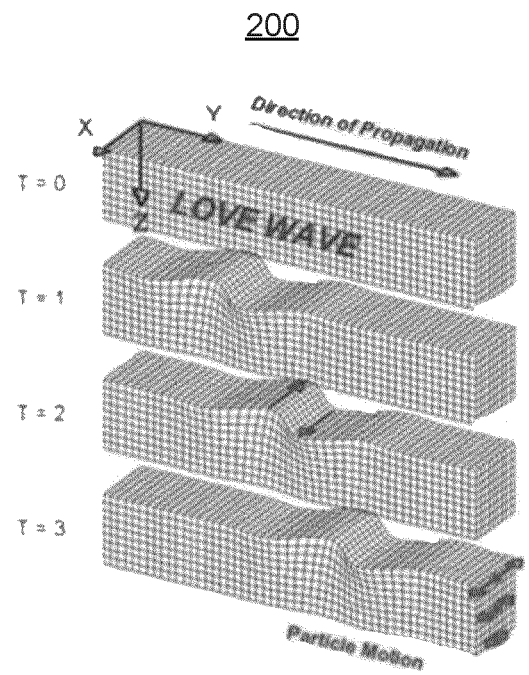
FIGS. 2A-2B are schematic diagrams representative of Love wave phenomena according to an embodiment of the present disclosure.
Figure 2B:
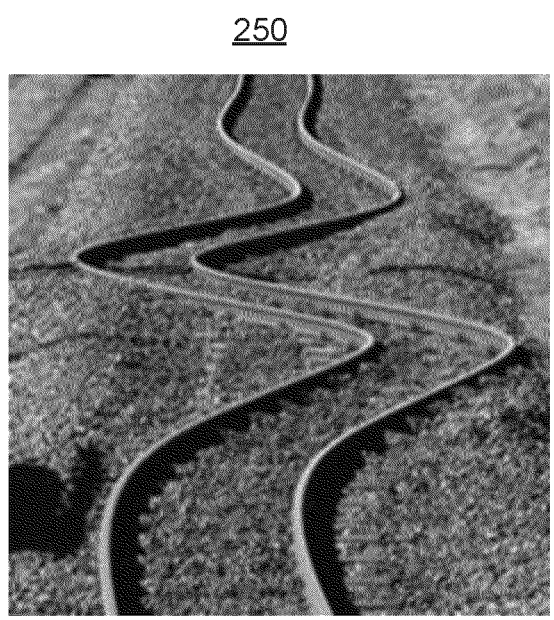

Wave motion that can be created in solid matter, such as Love waves, are characterized by side-to-side surface undulations perpendicular to the direction of propagation, similar to snake-like motion, but decreasing in amplitude with depth. Love waves are a form of surface wave. A Rayleigh wave is a wave that moves up and down perpendicular to the surface, as water waves do. By contrast, Love waves move laterally to their direction of motion while remaining in the plane of the surface. For example, FIG. 2A depicts a representation 200 of Love wave propagation as a function of time, and FIG. 2B depicts a representation 250 of deformations resulting from Love waves at the surface. In order for Love waves to exist, there must be two materials with different properties stacked together. The top layer must have a shear-wave speed less than the shear-wave speed in the underlying material. The shear-wave speed is defined by the square root of the modulus of rigidity (G) divided by the material density (ρ), shown in Equation 1 below:

$$c = \sqrt{\frac{G}{\rho}} \quad \text{(Equation 1)}$$

The present solution can enable more effective generation of transverse surface waves, including by generating Love waves to cause resulting surface action. The present solution can enable continuous localized deformation in the desired directions for power-efficient and mechanically robust drag control. For example, the present solution can generate Love waves to cause resulting surface action using a multiple layer stack (e.g., multilayer stack) that includes at least two layers, including a first layer (e.g., the top layer described above) and one or more second layers (the top layer having a shear-wave speed less than that of the one or more second layers, such as the underlying layers described above).

Figure 3:
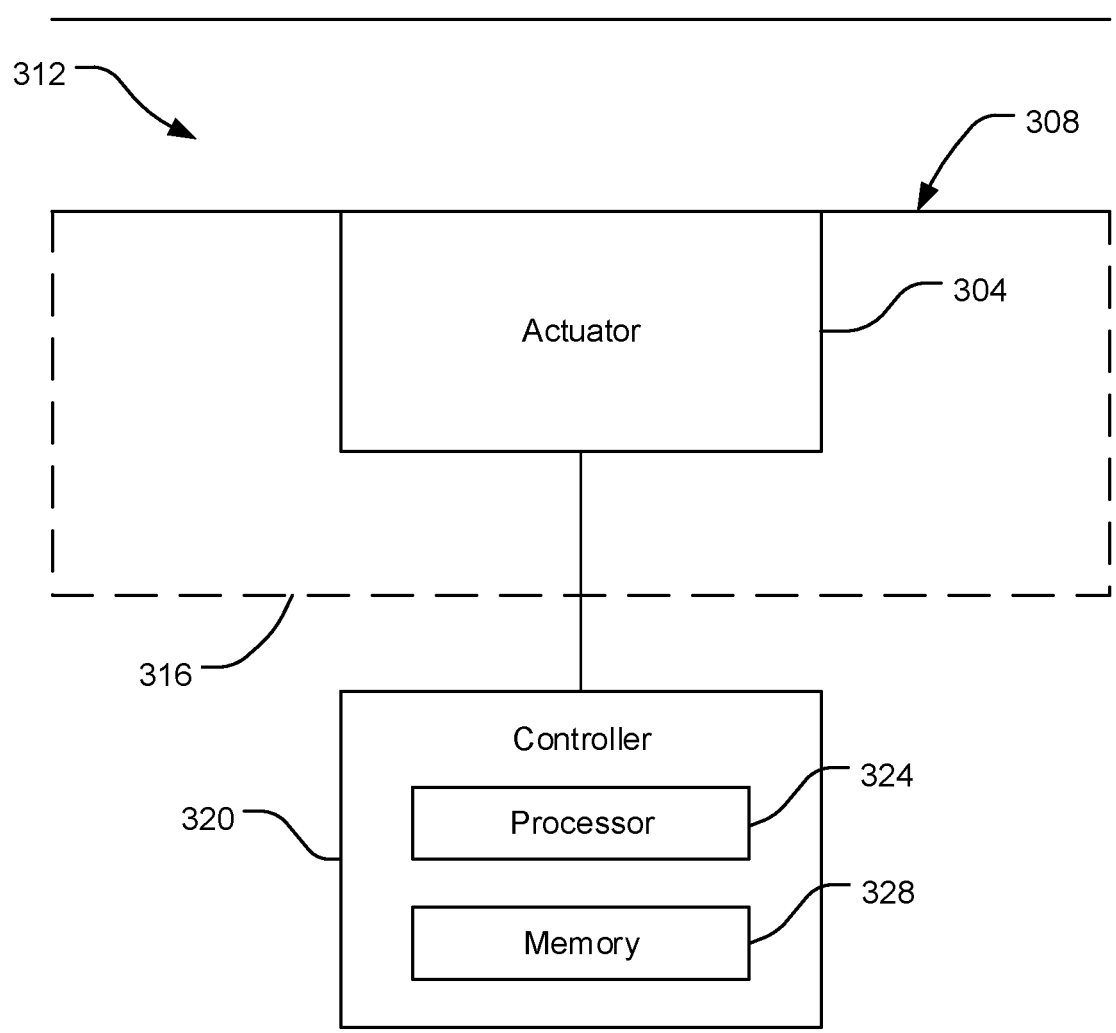
FIG. 3 is a schematic diagram of a fluid control system that selective generates surface waves according to an embodiment of the present disclosure.

Referring now to FIG. 3, a fluid control system 300 is depicted. The fluid control system 300 can incorporates features of various fluid control systems described herein. The fluid control system 300 includes an actuator 304 coupled to a surface 308 over which a fluid 312 flows. The actuator 304 moves the surface 308 relative to the fluid 312. For example, the actuator 304 can move the surface 308 to generate transverse surface waves, such as by propagating Love waves. The actuator 304 can be disposed in a body 316 defining the surface 308, such that the actuator 304 propagates Love waves in the body 316 to generate transverse surface waves at the surface 312. In some embodiments, the actuator 304 is coupled to a bulk material (e.g., the body 316), and can be actuated at least one of electrostatically or electromagnetically to propagate Love waves. The actuator 304 can avoid causing out-of-plane motion of the surface 308, which may be undesirable for effective drag modification, by using Love waves (e.g., the actuator 304 may cause no out-of-plane motion perpendicular to the surface 308; the actuator 304 may cause at most a minimal amount of out-of-plane motion perpendicular to the surface 308, movement of the surface 308 out of a plane of the surface 308 that is less than a threshold distance, for example, a threshold distance having a size scale that is five viscous length scale units or less relative to a viscous length scale of the fluid 312). The actuator 304 may be of relatively small size as compared to the surface 308; for example, the actuator 304 may be attached to less than a threshold fraction of the surface 308 (e.g., less than 75 percent of the surface 308; less than 50 percent of the surface 308; less than 25 percent of the surface 308; less than 10 percent of the surface 308; less than 5 percent of the surface 308; less than 1 percent of the surface 308).

In some embodiments, the surface 308 can include materials that facilitate transverse wave generation. For example, the surface 308 can include metamaterials designed to create the desired shear-wave speed difference in different layers. The surface 308 can be doped or etched to achieve a desired response to actuation by the actuator 304.

The fluid control system 300 includes a controller 320. The controller 320 can include a processor 324 and memory 328. The processor 324 can be a general purpose or specific purpose processor, an application specific integrated circuit (ASIC), one or more field programmable gate arrays (FPGAs), a group of processing components, or other suitable processing components. The processor 324 is configured to execute computer code or instructions stored in memory 328 or received from other computer readable media (e.g., CDROM, network storage, a remote server, etc.). Memory 328 can include one or more devices (e.g., memory units, memory devices, storage devices, etc.) for storing data and/or computer code for completing and/or facilitating the various processes described in the present disclosure. Memory 328 can include random access memory (RAM), read-only memory (ROM), hard drive storage, temporary storage, non-volatile memory, flash memory, optical memory, or any other suitable memory for storing software objects and/or computer instructions. Memory 328 can include database components, object code components, script components, or any other type of information structure for supporting the various activities and information structures described in the present disclosure. Memory 328 can be communicably connected to processor 324 via controller 320 and may include computer code for executing (e.g., by processor 324) one or more processes described herein. When processor 324 executes instructions stored in memory 328, processor 324 generally configures the controller 320 to complete such activities.

The controller 320 can generate a control signal to control operation of the actuator 304, such as to cause the actuator 304 to move the surface 308 relative to the fluid 312. The controller 320 can select parameters of the control signal, such as frequency and amplitude, based on desired transverse surface wave properties. For example, the controller 320 can select a parameter of the control signal corresponding to an expected change in drag of the fluid 312 relative to the surface 308. The controller 320 can execute a wave function that maps parameter(s) of the control signal to parameters of resulting transverse surface waves generated using operation of the actuator 304, and a drag function that maps the parameters of the resulting transverse surface waves to corresponding changes in drag of the fluid 312 flowing over the surface 308, and can execute the wave function and the drag function to select the parameter(s) of the control signal. As discussed with further reference to FIGS. 4A, 4B, and 5, the controller 320 can generate the control signal to include several control signals having differing parameters, including differing phases.

The controller 320 can control operation of the actuator 304 to control one or more parameters of the surface wave, such as at least one of an amplitude, wavelength, or frequency of the surface wave (e.g., amplitude A, wavelength $\lambda$, $\omega$ depicted in FIG. 1). For example, the controller 320 can control an amplitude, frequency, or intermittency of movement of the actuator 304 to control the one or more parameters of the surface. The controller 320 can control the one or more parameters of the surface wave based on a parameter of the fluid 312. For example, the controller 320 can control operation of the actuator 304 to achieve target values for the one or more parameters of the surface wave based on a viscous length scale $\eta$ of the fluid 312, where $\eta$ is defined according to Equation 3 below, where $\nu$ is the kinematic viscosity of the fluid 312, $\tau_w$ is the wall shear stress of the fluid 312 relative to the surface 308, and $\rho$ is the density of the fluid:

$$\eta = \frac{\nu}{\sqrt{\frac{\tau_w}{\rho}}} \quad \text{(Equation 2)}$$

Figure 4A:
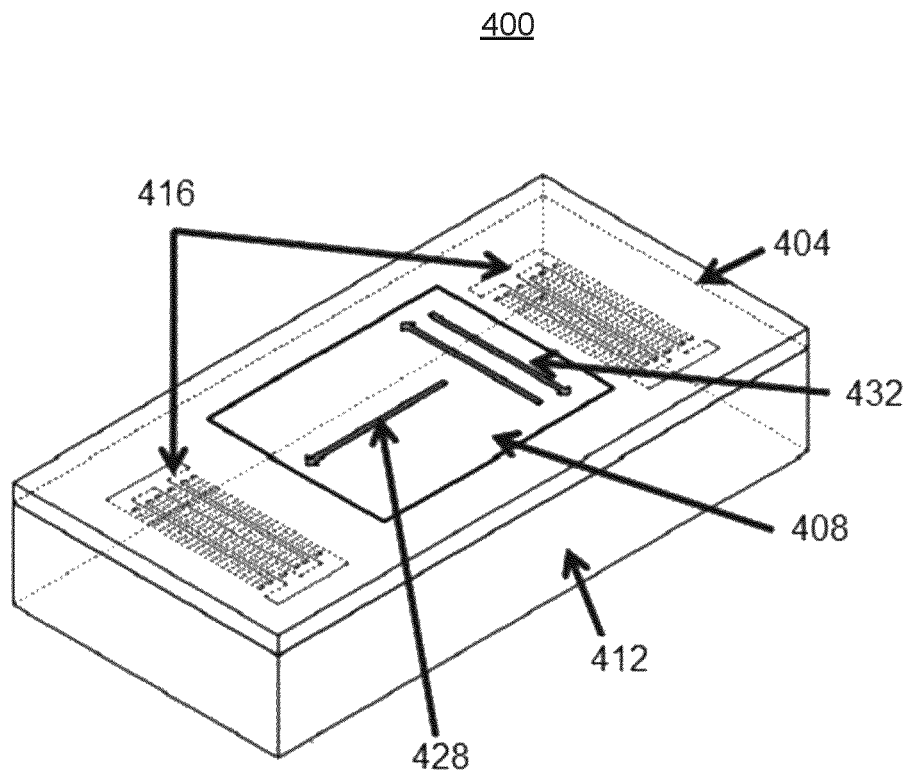
FIGS. 4A-4B are schematic diagrams of a surface acoustic wave device that can be used to implement the fluid control system of FIG. 3.
Figure 4B:
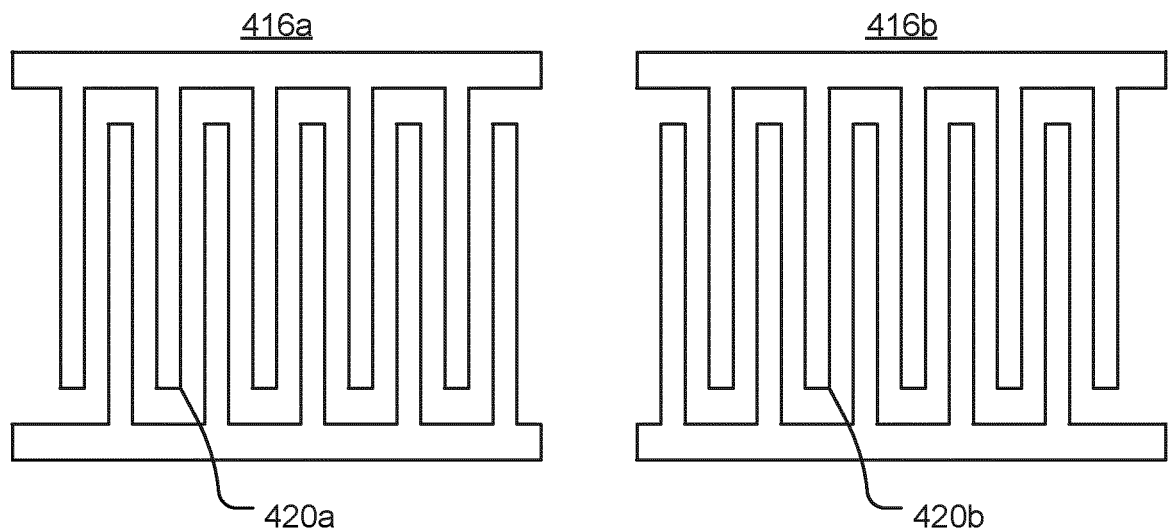

Referring now to FIGS. 4A-4B, a fluid control device 400 is depicted. The fluid control device 400 can be used to implement the fluid control system 300 described with reference to FIG. 3, such as to receive a control signal from the controller 316 and implement functions of the actuator 304 responsive to the control signal, including to generate transverse surface waves that result in desired changes to drag. The fluid control device 400 can be implemented as a surface acoustic wave device. The fluid control device 400 can be relatively thin and continuous, mitigating shortcomings of existing systems, such as multiple plate systems. The fluid control device 400 can be used to generate various surface waves, including transverse surface waves (e.g., via Love wave generation), standing waves, and travelling waves. The fluid control device 400 can also be used to generate Rayleigh waves and Stoneley waves; however, such waves may be less effective for controlling drag as compared to Love waves. Due to the relative small size and electrical current requirements for operation of the fluid control device 400, the fluid control device 400 can be used to achieve desired transverse surface wave generation while reducing power requirements and wear as compared to existing systems.

The fluid control device 400 includes a first layer 404 and a second layer 412. The first layer 404 can be a guiding layer. The first layer 404 can be made from silicon dioxide. The first layer 404 can include a sensor region 408 that can include one or more sensors that detect characteristics of a fluid flowing over the first layer 404 and/or characteristics of motion of the first layer 404. The first layer 404 can have a lower shear-wave speed or phase velocity than the second layer 412, which can enable Love wave generation.

The second layer 412 can be used to generate waves, such as to generate Love waves. The second layer 412 can be a piezoelectric layer. The second layer 412 can include a cut crystal, such as an AT-cut quartz. The second layer 412 can include lithium niobite. The second layer 412 can include PVDF (e.g., polyvinylidene fluoride; polyvinylidene difluoride).

In some embodiments, the second layer 412 includes a plurality of electrodes 416, which can be energized to generate acoustic waves that result in desired wave motion. The plurality of electrodes 416 may be deposited on the second layer 412 between the first layer 404 and the second layer 412. In some embodiments, the plurality of electrodes 416 include at least one pair of electrode patterns 416a, 416b. The electrode patterns 416a, 416b can be interdigital transducers. For example, as depicted in FIG. 4B, the electrode pattern 416a can include a plurality of interspaced digits of electrodes 420a, and the electrode pattern 416b can include a plurality of interspaced digits of electrodes 420b. Positioning and spacing of the electrode patterns 416a, 416b can be selected to control direction of waves generated using the second layer 412. Sizing of the electrode patterns 416a, 416b can be selected to control amplitude and other parameters of generated waves, and thus control changes to drag.

In some embodiments, a control signal received at the fluid control device 400 (e.g., from the controller 316 described with reference to FIG. 3) includes a first control signal and a second control signal. The first control signal can be used to energize the electrode pattern 416a, and the second control signal can be used to energize the electrode pattern 416*b*. In some embodiments, the first control signal and second control signal have different phases, which can be selected to generate desired surface waves. In some embodiments, the first control signal and second control signal have different frequencies, such that the electrode patterns 416*a*, 416*b* can generate a beat frequency (e.g., based on intermediate frequencies) based on a first frequency of operation of the electrode pattern 416*a* and a second frequency of operation of the electrode pattern 416*b*.

As depicted in FIG. 4A, the fluid control device 400 generates a Love wave that propagates in a direction 428 (e.g., occurs at different positions as a function of time along the direction 428). Propagation of the Love wave includes displacement of particles of the first layer 404 in a direction 432 perpendicular to the direction 428, similar to that depicted in FIGS. 2A-2B.

Figure 5:
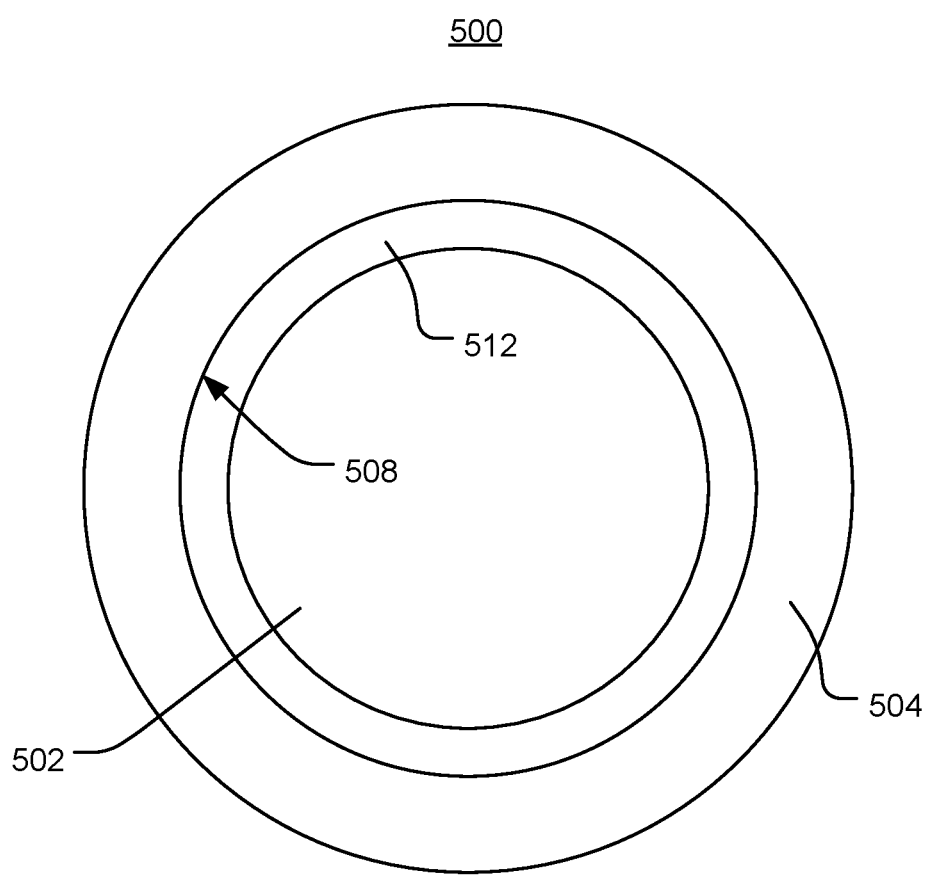
FIG. 5 is a schematic diagram of a pipe flow system implementing surface wave generation according to an embodiment of the present disclosure.

Referring now to FIG. 5, a flow system 500 is depicted. The flow system 500 includes a body through which a fluid 502 is flowing, depicted as pipe 504 having an inner layer 512 disposed on an inner surface 508 of the pipe 504. The inner layer 512 may be implemented using the fluid control system 300 and/or the fluid control device 400. For example, the inner layer 512 may include a piezoelectric material that can be actuated to generate transverse surface waves that modify drag in fluid 502 flowing through the pipe 504.

Figure 6:
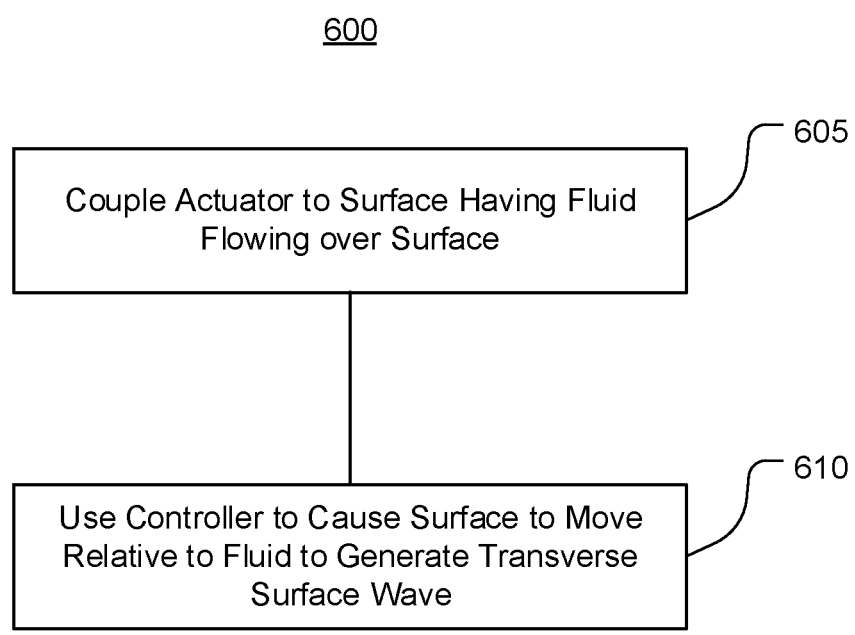
FIG. 6 is a flow diagram of a method of selectively generating surface waves according to an embodiment of the present disclosure.

Referring now to FIG. 6, a method 600 of active control of surface drag using selective wave generation is depicted. The method 600 can be performed using various systems and devices described herein, including the fluid control system 300 and fluid control device 400.

At 605, an actuator is coupled to a surface having a fluid flowing over the surface. The surface can be defined by a body over which the fluid flows, such as a movable platform (e.g., vehicle). The surface can be defined by a body through which the fluid flows, such as a pipe. The fluid can include at least one of air, water, or an oil. In some embodiments, the surface includes a semiconductor material that is doped to achieve a desired response to actuation by the actuator. In some embodiments, the actuator includes a plurality of electrodes. For example, the actuator can include a surface acoustic wave device that includes interdigitated electrode patterns.

At 610, a controller causes the actuator to cause the surface to move relative to the fluid, generating a surface wave that modifies drag in the fluid, such as to increase or decrease drag of the fluid relative to the surface. In some embodiments, a transverse surface wave is generated. In some embodiments, a Love wave is generated. In some embodiments, a shear wave is generated. In some embodiments, a standing wave is generated. In some embodiments, the actuator includes a plurality of electrodes that the controller causes to generate a beat frequency based on a first frequency of operation of a first subset of the plurality of electrodes and a second frequency of operation of a second subset of the plurality of electrodes.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

The term "coupled," as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. Such members may be coupled mechanically, electrically, and/or fluidly.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit and/or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the fluid control systems and methods of fluid control as shown in the various exemplary embodiments is illustrative only. Additionally, any element disclosed in one embodiment may be incorporated or utilized with any other embodiment disclosed herein. Although only one example of an element from one embodiment that can be incorporated or utilized in another embodiment has been described above, it should be appreciated that other elements of the various embodiments may be incorporated or utilized with any of the other embodiments disclosed herein.

What is claimed is:

1. A system, comprising:
a surface having a fluid flowing over the surface;
a multiple layer stack comprising at least a first layer facing the fluid and a second layer on an opposite side of the first layer from the fluid, the first layer comprising the surface, the first layer having a different shear-wave speed than the second layer, the first layer made from a different material than the second layer;
an actuator coupled to the surface to move the surface relative to the fluid; and
a controller that causes the actuator to generate a love wave in a plane of the surface to modify drag in the fluid.

2. The system of claim 1, wherein the controller is configured to control at least one of an amplitude, a wavelength, or a frequency of the love wave based on a parameter of the fluid.

3. The system of claim 1, wherein the surface is defined by a film covering an inner surface of a body through which the fluid flows.

4. The system of claim 3, wherein the body includes a pipe.

5. The system of claim 1, wherein the surface is defined by a film covering an outer surface of a body configured to move through the fluid.

6. The system of claim 1, wherein the actuator includes a plurality of electrodes.

7. The system of claim 6, wherein the actuator includes a surface acoustic wave device.

8. The system of claim 1, wherein the actuator includes a piezo-electric material.

9. The system of claim 1, wherein the actuator is attached to less than a threshold fraction of the surface.

10. The system of claim 1, wherein the actuator includes a plurality of electrodes arranged along one or more parallel axes.

11. The system of claim 10, wherein the controller drives the plurality of electrodes to generate the love wave to include a standing wave.

12. The system of claim 1, wherein the surface includes a semiconductor material that is doped to achieve a desired response to actuation by the actuator.

13. The system of claim 1, wherein the actuator does not move the surface out of a plane of the surface.

14. The system of claim 1, wherein the first layer has a shear-wave speed lower than a shear-wave speed of the second layer.

15. A system comprising,
a surface having a fluid flowing over the surface;
an actuator coupled to the surface to move the surface relative to the fluid; and
a controller that causes the actuator to cause the surface to generate a surface wave that modifies drag in the fluid, wherein the actuator includes a plurality of electrodes arranged to generate a beat frequency based on a first frequency of operation of a first subset of the plurality of electrodes and a second frequency of operation of a second subset of the plurality of electrodes.

16. A method, comprising:
coupling an actuator to a surface having a fluid flowing over the surface, wherein the surface is provided as a first layer of a multiple layer stack, the first layer facing the fluid, the multiple layer stack comprising a second layer on an opposite side of the first layer from the fluid, the first layer comprising the surface, the first layer having a different shear-wave speed than the second layer, the first layer made from a different material than the second layer; and
causing, by a controller, the actuator to generate a love wave in a plane of the surface to modify drag in the fluid.

17. The method of claim 16, further comprising controlling, by the controller, at least one of an amplitude, a wavelength, or a frequency of the love wave based on a parameter of the fluid.

18. The method of claim 16, wherein the surface is defined by a film covering an inner surface of a body through which the fluid flows.

19. The method of claim 18, wherein the body includes a pipe.

20. The method of claim 16, wherein the surface is defined by a film covering a body configured to move through the fluid.

21. The method of claim 16, comprising:
driving, by the controller, a plurality of electrodes of the actuator.

22. The method of claim 21, wherein the actuator includes a surface acoustic wave device.

23. The method of claim 16, wherein the actuator includes a piezo-electric material.

24. The method of claim 16, wherein the actuator is attached to less than a threshold fraction of the surface.

25. The method of claim 16, wherein the actuator includes a plurality of electrodes arranged along one or more parallel axes.

26. The method of claim 16, comprising:
driving, by the controller, the plurality of electrodes to generate the love wave to include a standing wave.

27. The method of claim 16, comprising:
driving, by the controller, a first subset of a plurality of electrodes of the actuator at a first frequency of operation; and
driving, by the controller, a second subset of the plurality of electrodes at a second frequency of operation to generate the love wave at a beat frequency corresponding to the first frequency of operation and the second frequency of operation.

28. The method of claim 16, wherein the surface includes a semiconductor material that is doped to achieve a desired response to actuation by the actuator.

29. The method of claim 16, comprising:
moving the surface, by the actuator, out of a plane of the surface by less than a thickness of the surface perpendicular to the plane.

* * * * *